(12) United States Patent
Walstrum, Jr. et al.

(10) Patent No.: US 7,339,400 B1
(45) Date of Patent: Mar. 4, 2008

(54) INTERFACE PORT FOR ELECTRICALLY PROGRAMMED FUSES IN A PROGRAMMABLE LOGIC DEVICE

(75) Inventors: James A. Walstrum, Jr., San Jose, CA (US); Steven E. McNeil, Rio Rancho, NM (US); Shalin Umesh Sheth, San Francisco, CA (US)

(73) Assignee: Xilinx, Inc., San Jose, CA (US)

( * ) Notice: Subject to any disclaimer, the term of this patent is extended or adjusted under 35 U.S.C. 154(b) by 69 days.

(21) Appl. No.: 11/449,935

(22) Filed: Jun. 9, 2006

(51) Int. Cl.
  *H03K 19/173* (2006.01)
  *H03K 19/177* (2006.01)
  *H03K 19/00* (2006.01)
(52) U.S. Cl. .......................... 326/41; 326/38; 326/39; 326/40; 326/47; 326/101
(58) Field of Classification Search ............ 326/37–41, 326/47, 101, 8
  See application file for complete search history.

(56) References Cited

U.S. PATENT DOCUMENTS

| 6,356,095 | B1 * | 3/2002 | Komoriya ................... 324/763 |
| 7,183,801 | B2 * | 2/2007 | Kao et al. ..................... 326/40 |
| 2004/0150426 | A1 * | 8/2004 | Zhu et al. ..................... 326/86 |

OTHER PUBLICATIONS

U.S. Appl. No. 09/765,907, filed Jan. 19, 2001, Trimberger.
U.S. Appl. No. 09/949,234, filed Sep. 7, 2001, Knapp.
U.S. Appl. No. 10/810,032, filed Mar. 26, 2004, Knapp.
U.S. Appl. No. 11/101,076, filed Apr. 7, 2005, Trimberger.
U.S. Appl. No. 11/223,388, filed Sep. 9, 2005, Knapp.
U.S. Appl. No. 11/450,755, filed Jun. 9, 2006, Walstrum et al.
U.S. Appl. No. 11/450,756, filed Jun. 9, 2006, Walstrum et al.

(Continued)

*Primary Examiner*—Rexford Barnie
*Assistant Examiner*—Thienvu Tran
(74) *Attorney, Agent, or Firm*—LeRoy D. Maunu; Lois D. Cartier

(57) ABSTRACT

A programmable logic device (PLD) includes electrically programmable fuses that may be programmed with an identifier of the PLD. The PLD also includes programmable tiles and an interface port that is coupled to a shift register and a subset of the programmable tiles. The interface port includes a control port and a first and second serial data signals. The shift register has a parallel input port to load the identifier from the set of electrically programmable fuses in response to a read command of the control port. The shift register serially shifts by one bit in response to a shift command of the control port, including shifting a bit from the subset of the programmable tiles to the shift register via the first serial data signal and shifting a bit from the shift register to the subset of the programmable tiles via the second serial data signal.

12 Claims, 12 Drawing Sheets

OTHER PUBLICATIONS

Xilinx, Inc.; "Virtex-4 FPGA Handbook"; Published Aug. 2, 2004; available from Xilinx, Inc., 2100 Logic Drive, San Jose, California 95124; pp. 519-521.

Xilinx, Inc.; "Virtex-II Pro™ Platform FPGA Handbook"; Published Oct. 14, 2002; available from Xilinx, Inc., 2100 Logic Drive, San Jose, California 95124; pp. 332-336.

Atmel, "32-megabit 2.7 volt DataFlash® AT45DB321C"; downloaded on May 24, 2006 from: //www.atmel.com/dyn/resources/prod_documents/doc3387.pdf; pp. 14.

Intel, "Intel StrataFlash® Memory (J3) Datasheet"; downloaded on May 24, 2006 from: //download.intel.com/design/flcomp/datashts/29066721.pdf; pp. 46-49.

Stephan Neuhold; XAPP694 (v1.0); "Reading User Data from Configuration PROMs"; Application Note; May 26, 2004; available from Xilinx, Inc. at www.xilinx.com; pp. 1-12.

Catalin Baetoniu et al.; XAPP780 (v1.0); "FPGA IFF Copy Protection Using Dallas Semiconductor/Maxim DS2432 Secure EEPROMs"; Application Note; Aug. 17, 2005; available from Xilinx, Inc. at www.xilinx.com; pp. 1-6.

\* cited by examiner

INTERFACE PORT FOR ELECTRICALLY PROGRAMMED FUSES IN A PROGRAMMABLE LOGIC DEVICE

FIELD OF THE INVENTION

The present invention generally relates to programmable logic devices (PLDs). More particularly, the invention relates to structures and methods of protecting the configuration data for a PLD from unauthorized duplication and misuse.

BACKGROUND OF THE INVENTION

Programmable logic devices (PLDs) are a well-known type of programmable integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The collective states of the individual memory cells then determine the function of the FPGA.

To program an FPGA to implement a circuit design, a user captures the circuit design using a well-known design capture tool, and then uses well-known software tools to convert the captured design into a device specific bitwise representation. The bitwise representation, commonly referred to as a configuration bitstream or configuration data, is typically stored in a non-volatile storage device such as a Programmable Read Only Memory (PROM) and written into the PLD using a predefined configuration process, or can be written into the PLD by an external device.

Note that the FPGA's configuration memory array is typically a volatile memory such as Static Random Access Memory (SRAM). Thus, when the FPGA is powered off, the configuration data stored in its configuration memory array is lost. Consequently, when the FPGA is again powered up, it must be re-configured using configuration data provided by the non-volatile storage device, as described above.

Consequently, a system including an FPGA typically includes a non-volatile memory storage device including the configuration data, and a bus or wire on which the configuration data is transmitted each time the system is powered up. The configuration data is therefore subject to interception from the bus or wire. Alternatively, the configuration data can be read from a programmed FGPA using a "readback" feature typically provided, or by using JTAG, for example. Potentially, an unscrupulous attacker can use this "pirated" configuration data to duplicate the system in an unauthorized manner. Additionally or alternatively, the configuration data potentially can be reverse-engineered to obtain the user design represented by the configuration data, and the user design could be analyzed or altered.

Various methods are known that can reduce the hazard of the unauthorized duplication of configuration data. For example, FPGA manufacturers routinely provide encoding and decoding for configuration data. The data stream is encoded using a key, e.g., by the same software that generates the unencrypted configuration data for the design. The encoded data is stored in a non-volatile memory device, from which it is downloaded to the-FPGA and decoded on-chip using the same key. Therefore, the transmitted configuration data is encoded, and anyone who does not have the key used to encode the data cannot decode the data to reverse-engineer or alter the design.

For example, the Virtex-4™ family of FPGAs from Xilinx, Inc. incorporates a 256-bit encryption scheme using the Advanced Encryption Standard (AES) encryption algorithm. The 256-bit key is transmitted to the Virtex-4 device via a JTAG port, and is stored in the device in volatile memory, where the value is maintained using a small external battery. The key cannot be read from the volatile memory, and if the battery is removed the value is erased. Therefore, the key cannot be retrieved or duplicated from the device. If an encrypted stream of configuration data is loaded into the Virtex-4device, but the encryption key used in generating the data stream does not match the decryption key stored on the device, the device does not function and behaves as if the configuration was not successful. The Virtex-II Pro™ family of FPGAs uses a similar system based on either the DES or the triple-DES algorithm, at the discretion of the user.

Encryption and decryption is an effective way of preventing the duplication and/or reverse-engineering of configuration data. However, this method does have some disadvantages. For example, the cost of providing the encryption/decryption functionality is borne by all users, not just those that desire the extra level of security. Additionally, there are extra hardware costs involved in programming and maintaining the keys. When the keys are SRAM-based, as in the exemplary FPGAs described above, an external battery must be provided. The keys must also be distributed and managed to maintain their secrecy, which carries a logistical cost.

Another copy protection technique involves using an attached secure device to authenticate a design. Authentication is different from copy-protection in that the configuration data is stored and transferred in an unencrypted form. Therefore, the configuration data can be duplicated at will. However, when configuration data is not properly authenticated, the design represented by the configuration data fails to operate in the target FPGA. One way of authenticating a design is to include an authentication key in a secure device coupled to the FPGA. For example, an authentication key can be stored in a secure EEPROM such as the Dallas Semiconductor/Maxim DS2432. A processor included in the FPGA checks the authentication key in the EEPROM against a known value programmed into the processor, e.g., by comparing a first hashed value obtained from the authentication key with a second hashed value obtained from the known value. The processor then either allows the user circuit to begin functioning (when they match), or disables the user circuit (when they do not match). The processor can be implemented in either hard-coded logic or soft logic in the FPGA. The disadvantages of using an attached secure device include the additional cost of the secure device, and the cost of the processor in the FPGA.

Another protection method involves the provision of so-called "Protection Registers" for processor code. For example, the Intel StrataFlash® memory device includes a 128-bit register comprising a 64-bit, factory-programmed, unalterable and unique identifier, and a 64-bit user-programmable field. The user-programmable field can be programmed, and then "locked" against future alteration. Therefore, this 64-bit field can be used to store, for example, an encryption or authentication key. The unique identifier can also be used, if desired, to provide the key for decrypting the processor code stored in the Flash memory device. The Atmel "C-" and "D-" series DataFlash® devices include a similar protection register. However, in both cases the encryption or authentication key has a known maximum number of bits (e.g., 128 bits for the StrataFlash device and 128 bytes for the DataFlash devices) and typically comprises either a single stored value or a simple concatenation of two values stored in the protection register. Given sufficient motivation, a key having these known attributes could potentially be reverse-engineered by a determined attacker, although the reverse-engineering process becomes more difficult with the larger key sizes available in some Flash memory devices.

Therefore, it is desirable to provide additional structures and methods that enable authentication for user designs implemented in programmable integrated circuits.

SUMMARY OF THE INVENTION

Various embodiments of the invention provide a programmable logic device (PLD) that includes an array of programmable tiles for programmable logic resources and programmable interconnect resources. The PLD also includes electrically programmable fuses and an interface port that is coupled to a shift register and a subset of the programmable tiles. The electrically programmable fuses are programmed with an identifier of the PLD, and the interface port includes a control port and a first and second serial data signals. The shift register has a parallel input port to load the identifier from the set of electrically programmable fuses in response to a read command of the control port. The shift register serially shifts by one bit in response to a shift command of the control port, including shifting a bit from the subset of the programmable tiles to the shift register via the first serial data signal and shifting a bit from the shift register to the subset of the programmable tiles via the second serial data signal.

Various other embodiments of the invention provide a method for manufacturing a programmable logic device (PLD). An integrated circuit is created that includes an array of programmable tiles, a set of electrically programmable fuses, and programming pads for the set of electrically programmable fuses. The programmable tiles include programmable logic resources and programmable interconnect resources, and a subset of the programmable tiles is coupled to the set of electrically programmable fuses by an interface port that includes a control port and serial input and output signals. The set of electrically programmable fuses is programmed with an identifier of the integrated circuit using the programming pads. The identifier includes a specification of a lot for the integrated circuit, a specification of a wafer for the integrated circuit in the lot, and a specification of a location of the integrated circuit in the wafer. The integrated circuit supplies the identifier from the set of electrically programmable fuses via the serial output signal of the interface port in response to a sequence of shift commands being provided to the control port of the interface port. The integrated circuit is mounted in a package that does not have external pins for at least one of the programming pads.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION OF THE DRAWINGS

The present invention is applicable to a variety of programmable integrated circuits (ICs). An appreciation of the present invention is presented by way of specific examples utilizing PLDs such as field programmable gate arrays (FPGAs). However, the present invention is not limited by these examples. Further, in the following description, numerous specific details are set forth to provide a more thorough understanding of the present invention. However, it will be apparent to one skilled in the art that the present invention can be practiced without these specific details.

Various embodiments of the invention provide an interface port to a set of electrically programmable fuses that may be programmed with an identifier. The interface port permits the identifier to be serially received from the electrically programmable fuses. During the serial shifting of the identifier from the electrically programmable fuses via the interface port, extra data may also be serially supplied via the interface port. Following the receiving of the identifier, this extra serially supplied data may be received back via the interface port. An authorization key may be generated from the identifier and the extra data. To deter counterfeiting of the key, the key may augment the identifier with the extra data and the source of the extra data may be obscured by sending and later receiving the extra data via the interface port.

Figure 1:
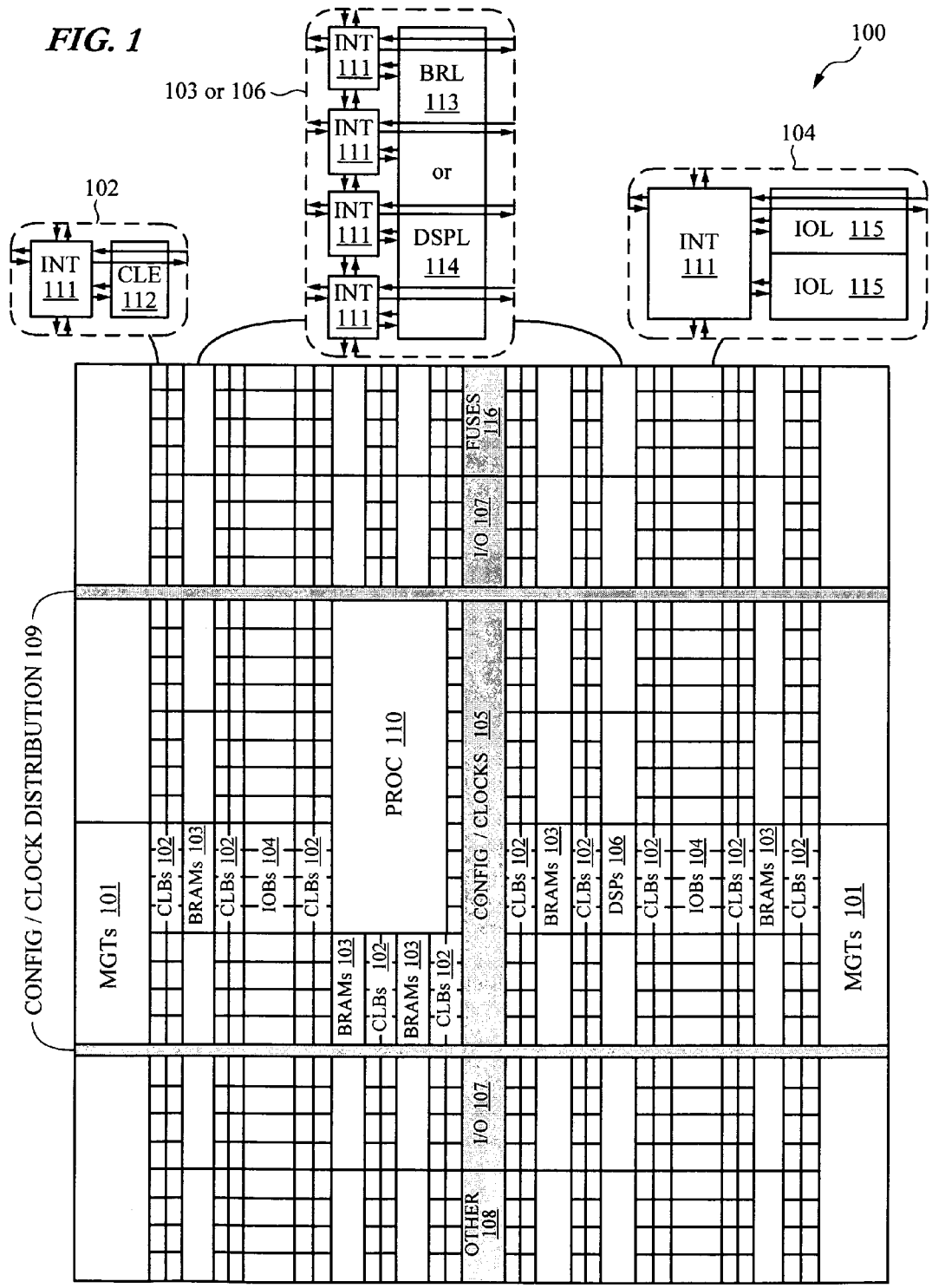
FIG. 1 is a block diagram of a programmable logic device including electrically programmable fuses in accordance with various embodiments of the invention.

FIG. 1 is a block diagram of a programmable logic device including electrically programmable fuses 116 in accordance with various embodiments of the invention. As noted above, PLDs can include several different types of programmable logic blocks in the array. For example, FIG. 1 illustrates an FPGA architecture 100 that includes a large number of different programmable tiles including electrically programmable fuses 116, multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layers above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2:
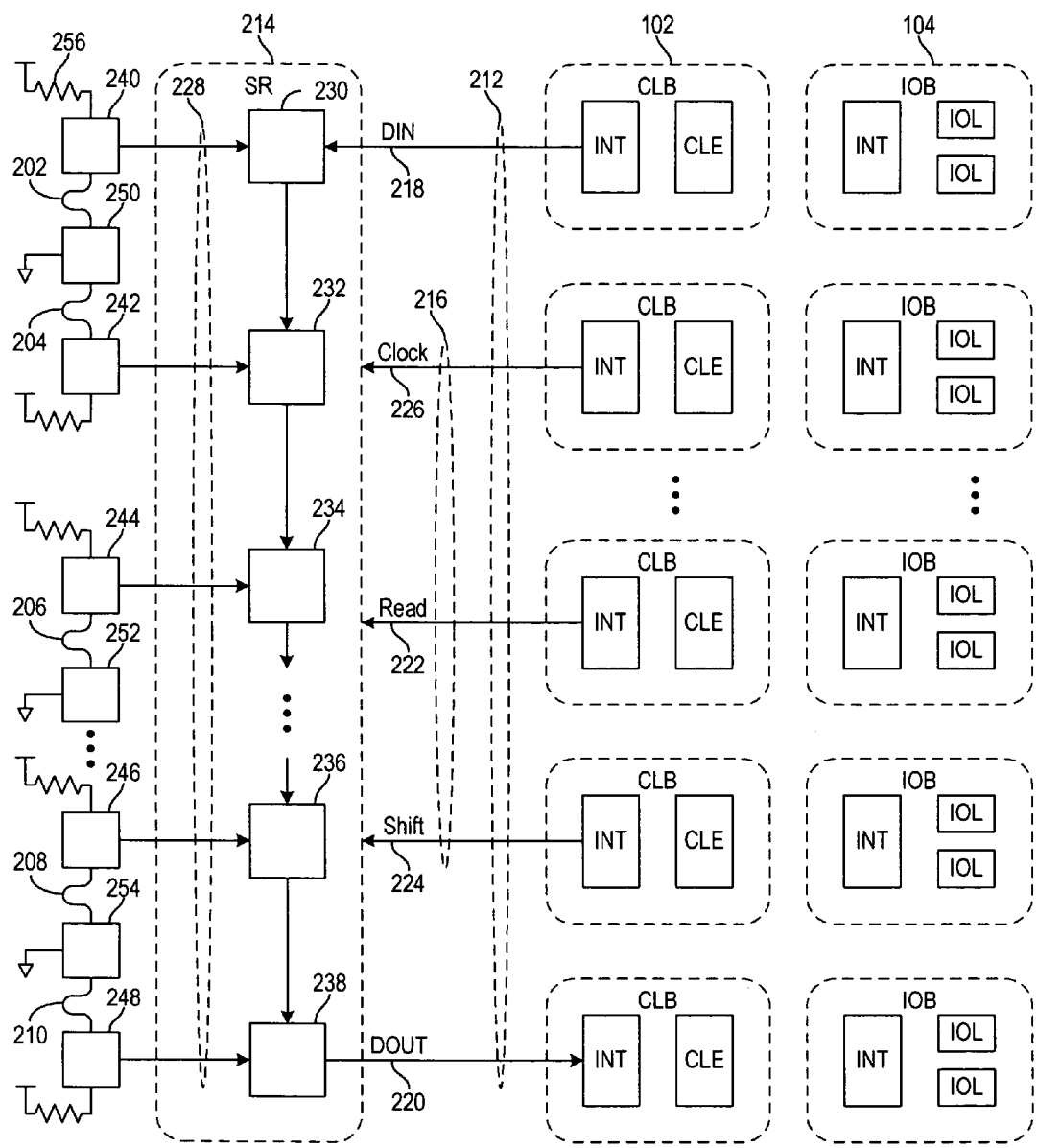
FIG. 2 is a block diagram illustrating access by programmable tiles to an identifier from electrically programmable fuses in accordance with various embodiments of the invention.

FIG. 2 is a block diagram illustrating access by programmable tiles to an identifier from electrically programmable fuses 202 through 210 in accordance with various embodiments of the invention. An interface port 212 couples a subset of the programmable tiles 102 and 104 to the electrically programmable fuses 202 through 210 via a shift register 214. The interface port 212 may include a control port 216, data input signal on line 218, and a data output signal on line 220. Control port 216 may include a read signal on line 222, a shift signal on line 224, and a clock signal on line 226.

The read signal on line 222 may provide a read command that loads the identifier from the electrically programmable fuses 202 through 210 into the shift register 214. In one embodiment, the read signal on line 222 is a latch signal and the read command is an active pulse of the read signal on line 222. In another embodiment, the read signal on line 222 provides an active edge for registers 230 through 238 that are edge-triggered flip-flops. In yet another embodiment, the read signal on line 222 is a clock enable and the read command is an assertion of the read signal on line 222 at an active edge, such as the rising edge, of the clock signal on line 226. The read command may load the identifier from the electrically programmable fuses 202 through 210 into the shift register 214 via the parallel input port 228 of the shift register 214. The parallel load of the identifier into the shift register 214 may load a bit of the identifier from electrically programmable fuse 202 into register 230, a bit of the identifier from electrically programmable fuse 204 into register 232, a bit of the identifier from electrically programmable fuse 206 into register 234, a bit of the identifier from electrically programmable fuse 208 into register 236, and a bit of the identifier from electrically programmable fuse 210 into the register 238.

A shift command may serially shift the shift register 214, including shifting a bit from register 238 to the data output signal on line 220, shifting a bit from register 236 to register 238, shifting a bit from register 234 to register 236, shifting a bit from register 232 to register 234, shifting a bit from register 230 to register 232, and shifting a bit from the data input signal on line 218 into register 230. The shift command may be provided by the shift signal on line 224. The shift signal on line 224 is a latch signal having an active pulse in one embodiment, the shift signal on line 224 provides an active edge for edge-triggered flip-flops in another embodiment, and the shift signal on line 224 is a clock enable for an active edge of the clock signal on line 226 in yet another embodiment.

Programming pads 240 through 248 may be used to respectively program electrically programmable fuses 202 through 210. In one embodiment, pads 250, 252, and 254 are also programmable pads used to program electrically programmable fuses 202 through 210. In another embodiment, pads 250, 252, and 254 are not programming pads and may be used for other purposes, such as providing power or ground.

Initially, the electrically programmable fuses 202 through 210 may be created to be electrically conductive as shown in FIG. 2. For example, electrically programmable fuse 202 may be created to short programming pad 240 to pad 250. Because electrically programmable fuse 202 shorts programming pad 240 to the ground of pad 250, programming pad 240 may be at a ground potential despite pull-up resistance 256. It will be appreciated that electrically programmable fuse 202 may be created to initially have a resistance that is small as compared to pull-up resistance 256.

Figure 3:
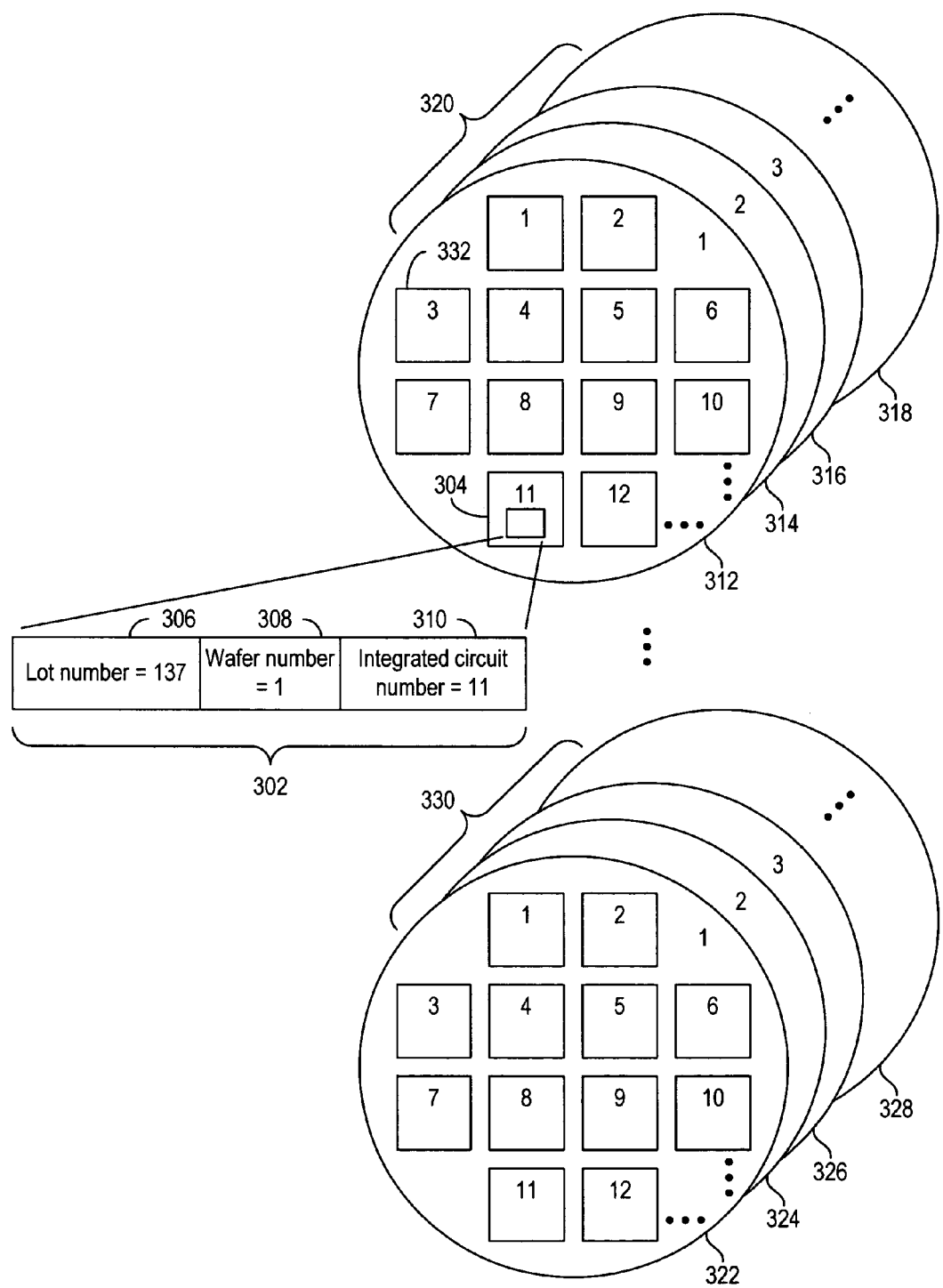
FIG. 3 is a diagram illustrating an identifier for an integrated circuit, in accordance with various embodiments of the invention.

FIG. 3 is a diagram illustrating an identifier 302 for an integrated circuit 304 including a lot number field 306, a wafer number field 308, and a field 310 for an integrated circuit number, in accordance with various embodiments of the invention. Electrically programmable fuse circuitry of the integrated circuit 304 may be programmed to provide the identifier 302.

The wafers 312, 314, 316, and 318 of lot 320 may be processed together during the fabrication steps that create the circuitry on these wafers. Similarly, the wafers 322, 324, 326, and 328 of lot 330 may be processed together. Each lot 320 and 330 may be assigned a lot number or other identifier, for example, lot 320 may be assigned identifier lot-137 included in lot number field 306 of identifier 302 of integrated circuit 304. Each wafer in a lot may have a wafer number or other identifier, for example, wafer 312 of lot 320 (and wafer 322 of lot 330) may be assigned an identifier wafer-1 included in wafer number field 308 of identifier 302 of integrated circuit 304. Each integrated circuit of a wafer may be assigned a location number or other identifier, for example, integrated circuit 332 may be assigned integrated circuit number-3 and integrated circuit 304 may be assigned integrated circuit number-11, which is included in field 310 of identifier 302. In one embodiment, the combination of the lot number, the wafer number, and the integrated circuit number may uniquely identify an integrated circuit, such that the identifier 302 uniquely identifies integrated circuit 304.

It will be appreciated that the identifier 302 may be provided by electrically programmable fuses that are programmed during later stages of the manufacturing of integrated circuit 304 to provide the identifier 302. For example, the fabrication of the circuitry of integrated circuit 304 may be completed before the electrically programmable fuses are programmed. The lot number, wafer number, and integrated circuit number for each integrated circuit may be tracked by the manufacturing process until the electrically programmable fuses are programmed during a final stage of the manufacturing process.

Figure 4:
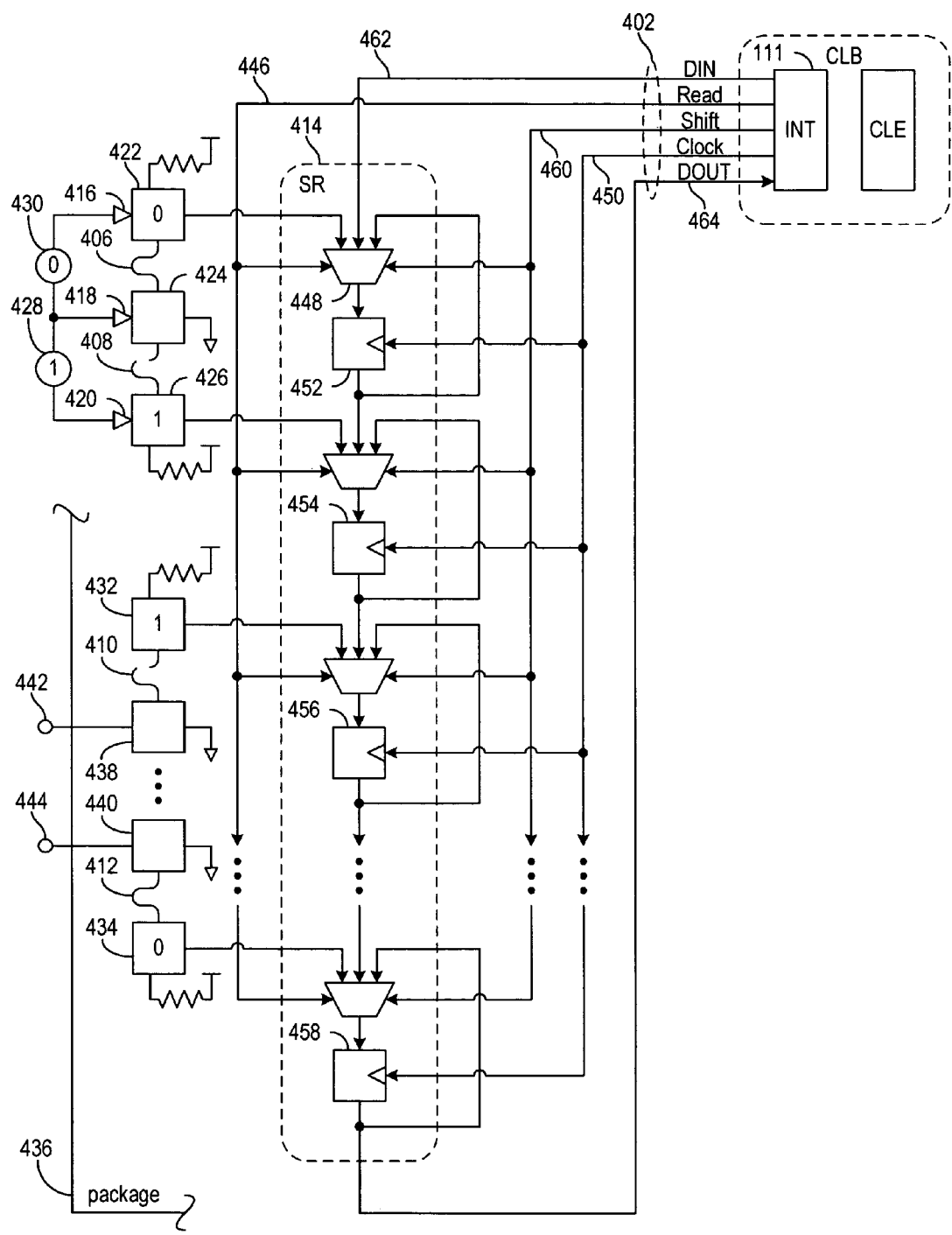
FIG. 4 is a block diagram of an interface port between a programmable interconnect element and electrically programmable fuses in accordance with various embodiments of the invention.

FIG. 4 is a block diagram of an interface port 402 between a programmable interconnect element 111 and electrically programmable fuses 406, 408, 410, and 412, in accordance with various embodiments of the invention. Shift register 414 couples the interface port 402 to the electrically programmable fuses 406, 408, 410, and 412.

Wafer probing may be used to connect test equipment to a fabricated integrated circuit to test the proper functioning of the integrated circuit. In addition, during wafer probing the electrically programmable fuses 406, 408, 410, and 412 may be programmed with an identifier of the integrated circuit. Each electrically programmable fuse 406, 408, 410, and 412 may be initially fabricated to have an electrically conductive state, and a current may be passed through certain of the fuses to cause heating effects that switch these fuses to a substantially electrically non-conductive state. During wafer probing, probe points 416, 418, and 420 may be respectively connected to pads 422, 424, and 426 of the integrated circuit. To change electrically programmable fuse 408 to a non-conductive state, probe points 418 and 420 may be used to connect power source 428 to electrically programmable fuse 408, and power source 428 may deliver sufficient current to "blow" electrically programmable fuse 408. Power source 430 may similarly be capable of changing electrically programmable fuse 406 from a conductive to a non-conductive state by delivering current through probe points 416 and 418 and pads 422 and 424. Electrically programmable fuses 408 and 410 are indicated as programmed to a non-conductive state by a discontinuous line that represents an open circuit for the fuses.

Each bit of the identifier of the integrated circuit may be programmed into a corresponding one of the electrically programmable fuses 406, 408, 410, and 412, and depending on whether or not the value of a bit of the identifier is a zero or a one, the corresponding electrically programmable fuse may be changed from an electrically conductive state to a comparatively non-conductive state, or the corresponding electrically programmable fuse may be left in the electrically conductive state. It will be appreciated that fuses 406, 408, 410, and 412 may be anti-fuses.

In one embodiment, programming pads 422, 426, 432, and 434 are accessible during wafer probing for testing the integrated circuit and for programming electrically programmable fuses 406, 408, 410, and 412. After the integrated circuit is mounted inside a package 436, the programming pads, such as pads 432 and 434, may lack corresponding external pins. Thus, a user of the packaged integrated circuit is prevented from changing the programming of the electrically programmable fuses 406, 408, 410, and 412, including being prevented from creating multiple packaged integrated circuits with duplicated identifiers. It will be appreciated that pads 438 and 440 of the packaged integrated circuit might or might not have corresponding pins 442 and 444 of the package 436.

Shift register 414 is used to provide the identifier from electrically programmable fuses 406, 408, 410, and 412 to the interface port 402. An assertion of the read signal on line 446 may cause multiplexer 448 to output the value of a bit of the identifier from electrically programmable fuse 406, and an active edge of the clock signal on line 450 may load this value into register 452. The read command of an active edge of the clock signal on line 450 during an assertion of the read signal on line 446 may similarly load the value of fuses 408, 410, and 412 in parallel into registers 454, 456, and 458, respectively. An assertion of the shift signal on line 460 may cause multiplexer 448 to output the value from the data input signal on line 462, and an active edge of the clock signal on line 450 may shift this value into register 452. The shift command of an active edge of the clock signal on line 450 during an assertion of the shift signal on line 460 may similarly shift the value of register 452 to register 454, shift the value of register 454 to register 456, and shift the value of register 456 to register 458. In addition, the value of register 458 may be provided to the programmable interconnect element 111 via the data input signal on line 464 of interface port 402. A read command followed by a sequence of shift commands may serially provide the identifier from the electrically programmable fuses 406, 408, 410, and 412 to the programmable interconnect element 111 via interface port 402.

When neither the read signal on line 446 nor the shift signal on line 460 is asserted during the active edge of the clock signal on line 450, multiplexer 448 may re-circulate the output of register 452 to the input of register 452, and registers 452, 454, 456, and 458 may maintain their current values.

In an alternative embodiment, one or both of the read signal and the shift signal may be latch signals. For example, the read signal may be a latch signal as specified by the following Verilog description of an alternative embodiment of the shift register 414:

```
module shift_register (fuse_identity, clock, read, shift,
    data_in, data_out);
    input fuse_identity[0:56];
    input clock;
    input read;
    input shift;
    input data_in;
    output data_out;
    reg data_out;
    reg[0:56] shift_reg;
    always @ (posedge read or negedge read) begin
        if (read)
            shift_reg=fuse_identity;
    end
    always @ (posedge clock) begin
        if (shift) begin
            shift_reg<={data_in, shift_reg[0:55]};
        end
        data_out<=shift_reg [56];
    end
endmodule
```

Figure 5:
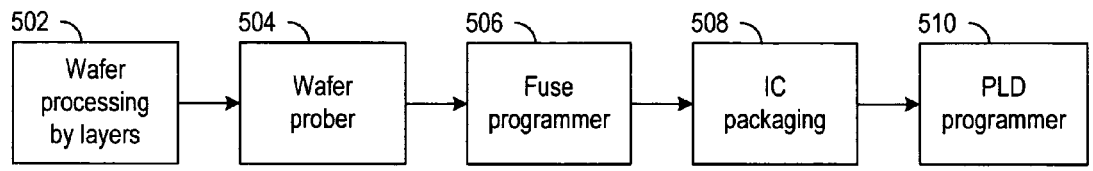
FIG. 5 is a block diagram of a system for manufacturing and using a programmable logic device with an identifier in accordance with various embodiments of the invention.

FIG. 5 is a block diagram of a system for manufacturing and using a programmable logic device with an identifier in accordance with various embodiments of the invention. Wafer processing 502 fabricates circuitry on one or more wafers, with the circuitry arranged into integrated circuits on each wafer and each integrated circuit including a set of electrically programmable fuses. Wafer processing 502 may include depositing various layers that define various aspects of the circuitry. Wafer prober 504 probes certain pads of each integrated circuit to test the proper operation of each integrated circuit. The integrated circuits may be tracked as either passing or failing the tests.

Fuse programmer 506 may program an identifier of each integrated circuit into the electrically programmable fuses created by wafer processing 502. The identifier programmed into the electrically programmable fuses of a particular integrated circuit may be the lot, wafer, and integrated circuit numbers of the particular integrated circuit, or another identifier of the particular integrated circuit. Integrated circuit packaging 508 may package each integrated circuit that passes the wafer probing test of block 504. The package may omit external pins for certain programming pads used by fuse programmer 506 to program the electrically programmable fuses. The packaged integrated circuits may be tested again to verify continued proper operation.

PLD programmer 510 programs the programmable logic and interconnect resources of an integrated circuit that is a programmable logic device (PLD). The PLD may be programmed to implement a user design. While wafer processing 502, wafer prober 504, fuse programmer 506, and integrated circuit package 508 generally are part of a manufacturing facility, the PLD programmer 510 is generally outside the manufacturing facility.

Figure 6:
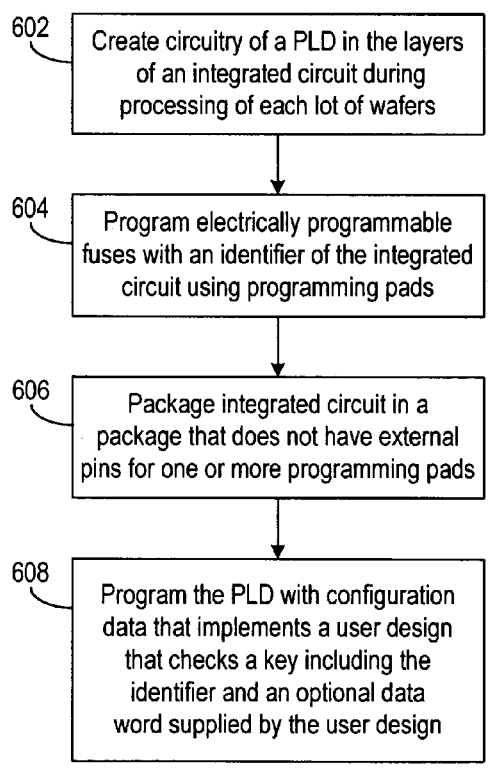
FIG. 6 is a flow diagram of a process for manufacturing a programmable logic device with an identifier in accordance with various embodiments of the invention.

FIG. 6 is a flow diagram of a process for manufacturing a programmable logic device with an identifier in accordance with various embodiments of the invention. At step 602, the circuitry of a PLD is created in the layers of an integrated circuit during the processing of each lot of wafers. At step 604, electrically programmable fuses of the integrated circuit are programmed with an identifier of the integrated circuit using programming pads of the integrated circuit. At step 606, the integrated circuit is mounted in a package that omits external pins for one or more of the programming pads. In one embodiment, the package omits external pins for all of the programming pads. At step 608, the PLD is programmed with configuration data that implement a user design in the programmable logic and routing resources of the PLD. The user design may check a key that includes the identifier. The key may include an optional data word that may be a function of the identifier, and may be supplied by the user design.

Figure 7:
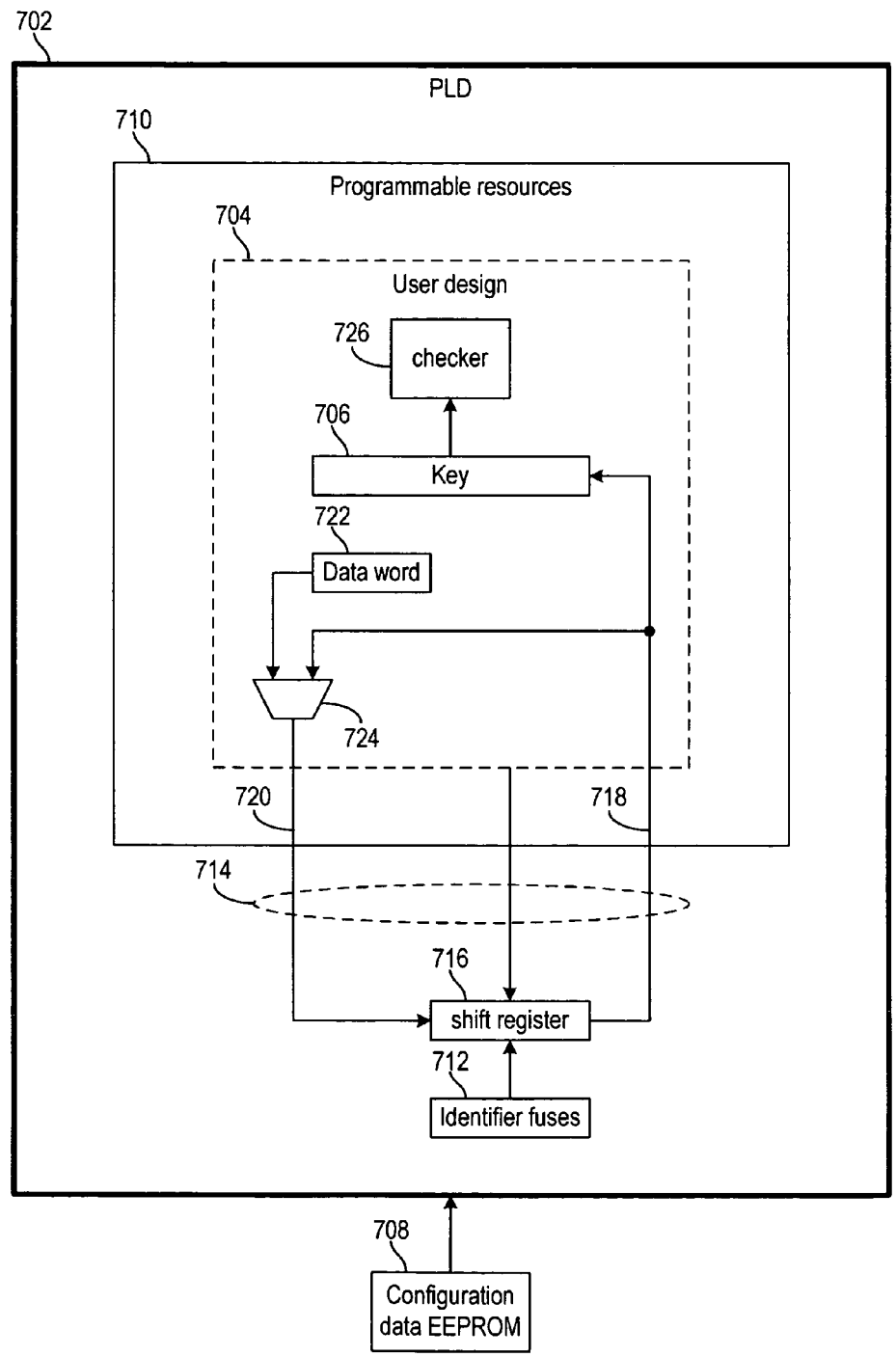
FIG. 7 is a block diagram of a programmable logic device programmed with configuration data for a user design that checks a key in accordance with various embodiments of the invention.

FIG. 7 is a block diagram of a programmable logic device 702 programmed with configuration data for a user design 704 that checks a key 706 in accordance with various embodiments of the invention. The configuration data may be received by the PLD 702 from an external non-volatile memory 708 or from an internal non-volatile memory (not shown). The configuration data may be used to program programmable logic and interconnect resources 710 to implement the user design 704.

The fuses 712 may provide an identifier of the PLD 702 that may be a unique identifier in certain embodiments. The user design 704 may access the identifier from the fuses 712 using an interface port 714. The identifier from the fuses 712 may be loaded into a shift register 716 and serially shifted from the shift register 716 via the data signal on line 718 to a subset of the programmable logic and interconnect resources 710 of the user design 704. The user design 704 may also serially shift data to the shift register 716 via the data signal on line 720.

A portion of the key 706 may include the identifier from fuses 712 or the key 706 may be an indirect function of the identifier from the fuses 712. In one embodiment, the key 706 is the identifier from the fuses 712 augmented with an additional data word 722 from the user design 704. The identifier from the fuses 712 may be loaded into shift register 716 and then shift register 716 may be serially shifted to transfer the identifier to the key 706 while the user design serially supplies the data word 722 to the shift register 716 via the data signal on line 720. After the identifier is serially transferred from shift register 716 to key 706, continued shifting of the shift register 716 may shift the value of the data word 722 from the shift register 716 to the key 706. In another embodiment, the identifier from the fuses 712 may be loaded into shift register 716 and then shift register 716 may be serially shifted to transfer the identifier to the key 706 while the bits of the identifier are re-circulated from the data signal on line 718 to the data signal on line 720. After the identifier is serially transferred from the shift register 716 to the key 706, continued shifting of the shift register 716 may shift the re-circulated identifier to the key 706. The re-circulation from the data signal on line 718 to the data signal on line 720 may be specified by the user design 704, or may be a feature (not shown) of the design of the PLD 702.

In yet another embodiment, instead of the user design 704 having a fixed selection of supplying to the data signal on line 720 a data word 722 or a re-circulated identifier, the user design 704 may include a multiplexer 724 as shown in FIG. 7 that selects between supplying a data word 722 or a re-circulated identifier to the data signal on line 720. In an alternative embodiment, multiplexer 724 may be replaced by a more complex function that may include additional state variables.

In one embodiment, the fuses 712 may provide 57-bits of identifier. For certain applications, a key 706 may be needed that has more bits than are provided by the fuses 712, for example, a key 706 with 128-bits may be needed. The source of the additional bits that augment the identifier to generate the key 706 may be obscured by an interface port 714 that permits additional bits to be supplied at the data signal on line 720. Later, these additional bits, or a processing of these additional bits and optionally the value of the shift register 716, are provided at the data signal on line 718. The obscuring of the source of the additional bits for the key 706 may increase the difficultly of counterfeiting the key 706.

A checker 726 may check the value of the key 706. In one embodiment, the checker 726 may compare the value of the key 706 with an expected value, and the operation of the user design 704 may be inhibited or diminished when the value of the key 706 does not match the expected value. The expected value may be included in the configuration data from the non-volatile memory 708. The configuration data from the non-volatile memory may be intended for a PLD 702 that has a specific value of the identifier from fuses 712. The checking by checker 726 may prevent configuration data in non-volatile memory 708 from being copied and used to implement a fully functional user design 704 in another PLD. In another embodiment, the checking by checker 726 may involve cryptographic functions to thwart counterfeiting attempts that copy the configuration data while modifying the expected value in the configuration data to a value that matches the key that is generated by another PLD.

Figure 8:
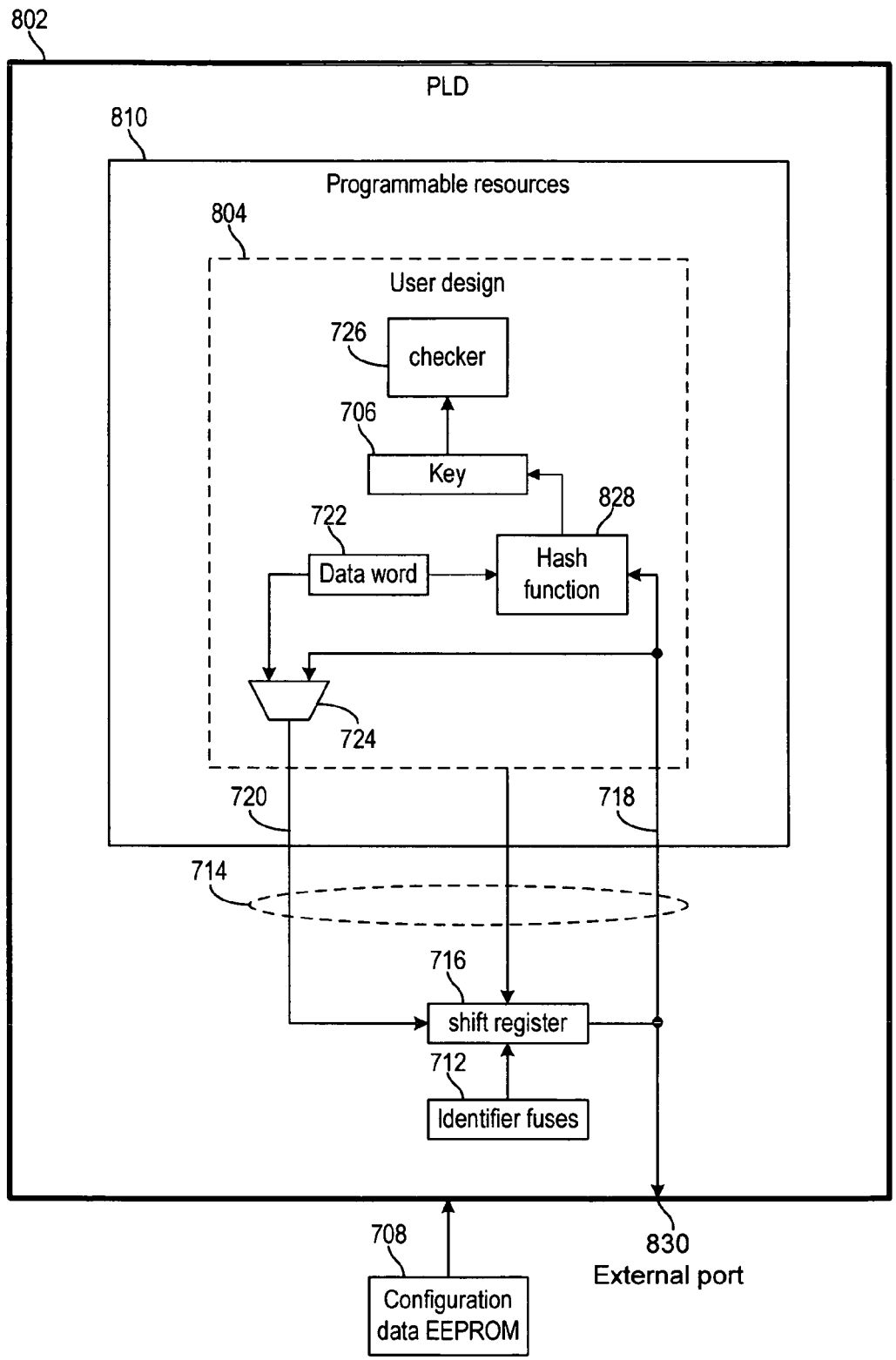
FIG. 8 is a block diagram of a second programmable logic device programmed with configuration data for a user design that checks a key in accordance with other embodiments of the invention.

FIG. 8 illustrates another programmable logic device 802 in which a hash function 828 is performed on the data word 722 and the output of the shift register 716 in order to generate the key 706. The hash function can be, for example, a cryptographically secure one-way algorithm that is easy to calculate but difficult to reverse engineer. Hash functions and circuits for generating hash functions are well known. As in the embodiment of FIG. 7, the key is based on two values from two different sources: a first value (the identifier) stored in the identifier fuses 712 as described above, and a second value (the data word 722) read from the user design 804. The two values can be combined by shifting the two values through the shift register 716, as described above. However, an additional layer of complexity is added by performing the hash function on the data word and the output of the shift register. This additional layer of complexity reduces the chances of an attacker successfully reverse-engineering the user design, or successfully copying the design to a different PLD.

In the pictured embodiment, the authentication process is performed by circuitry implemented using the programmable resources 810 of the programmable logic device 802. This circuitry constitutes a first portion of the user design. A second portion of the user design (not shown in FIG. 8) is enabled by checker 726 when the user design is authenticated, or disabled by checker 726 when the user design is not authenticated.

Because the hash function is implemented using the programmable resources of the PLD, the user determines and controls the function performed, i.e., selects and implements the algorithm for the hash function. Therefore, the user determines how elaborate the algorithm should be, and allows the algorithm to be kept secret to the customer. Further, the combination of a hash function 828 and a shift register 716 as illustrated in FIG. 8 allows the key to have virtually any desired number of bits, within the limits imposed by the size of the PLD, the size of the external memory storing the expected value, the time required to generate the key and perform the comparison, and so forth.

In some embodiments, the output data from shift register 716 is externally accessible via an external port 830. External port 830 can be, for example, a JTAG port or a bus access port.

Figure 9:
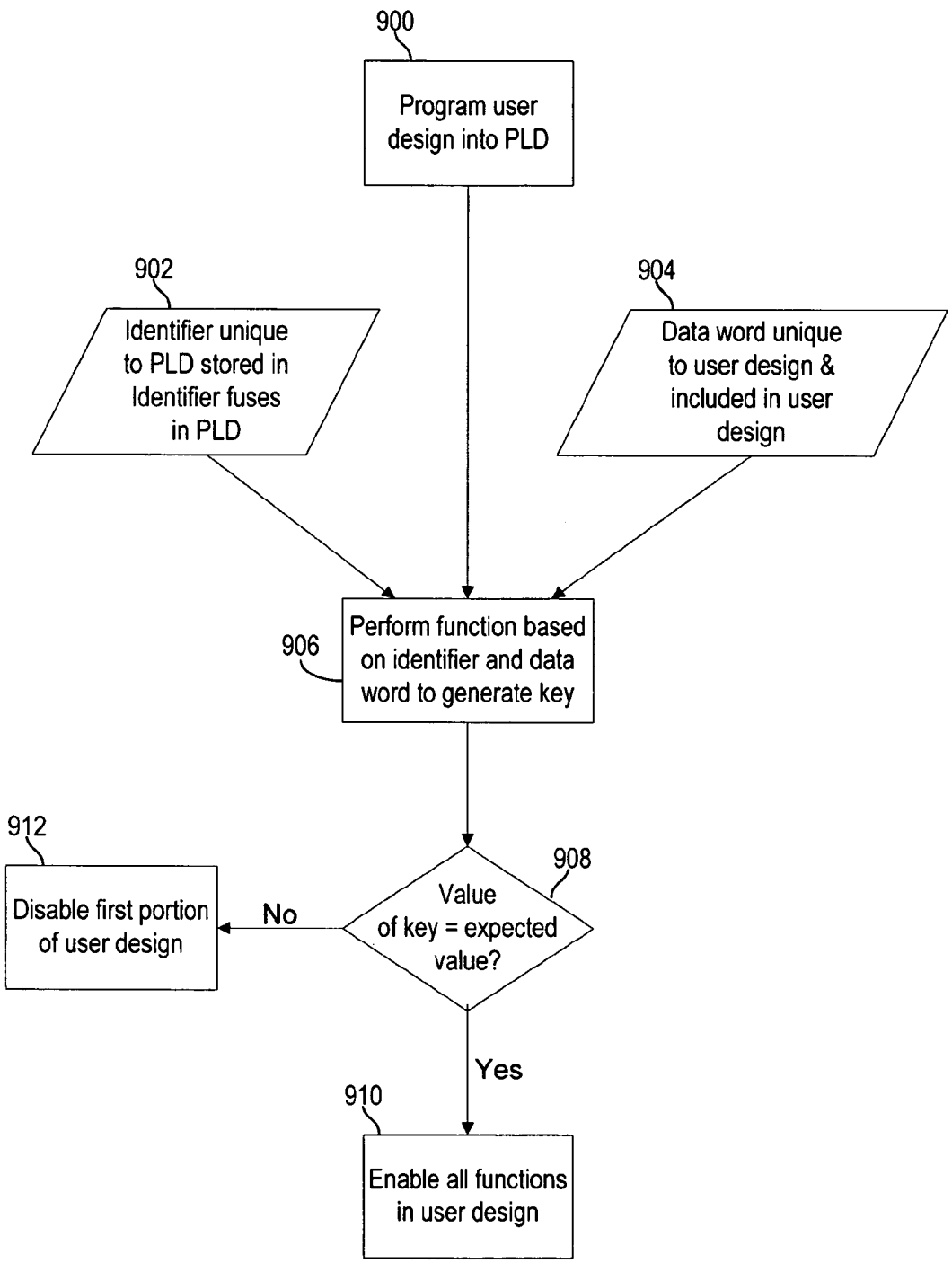
FIG. 9 illustrates the steps of a first method of authenticating a user design in a programmable IC in accordance with some embodiments of the present invention.

FIG. 9 illustrates the steps of a first method of authenticating a user design programmed into a programmable integrated circuit (e.g., a PLD) in accordance with one aspect of the present invention. In step 900, the user design is programmed into the PLD, e.g., by loading a stream of configuration data from an external memory device.

For the next step, two data values are used: an identifier 902 that is unique to the PLD; and a data word 904. In some embodiments, the data word 904 is unique to the user design, e.g., identifies the design uniquely to the user. The identifier 902 can be stored in non-volatile memory in the PLD, for example, by a PLD manufacturing facility, and can identify, for example, the lot number, wafer number within the lot, and position of the PLD die on the wafer. For example, the identifier 902 can be written to the PLD by programming electrically programmable fuses or anti-fuses, as described above. The data word 904 can be written to the PLD as part of the configuration data for the user design, for example. Alternatively or additionally, the data word 904 can constitute data read from various points within the user design (e.g., the states of certain nodes in the design) immediately after configuration or after a predetermined number of clock cycles have occurred. In some embodiments, the data word 904 is written into the user design after the end of the configuration process, but at a later time prior to step 906.

In step 906, a function is performed based on the identifier 902 and the data word 904, and a key is generated by the function. For example, the function can include a concatenation of the identifier 902 and the data word 904 using, for example, shift register 716 of FIGS. 7 and 8. Additionally, some or all of the identifier 902, the data word 904, and the concatenation can be added more than once to the string of bits generated by shift register 716, via multiplexer 724. Additionally or alternatively, the function can include a hash function, for example, of the data word 904 and the output of shift register 716, as shown in FIG. 8. In some embodiments, shift register 716 is omitted (see FIGS. 7 and 8) and the hash function 828 is performed on the data word 722 and the identifier from identifier fuses 712. The identifier is unique to the particular PLD, so when the data word is unique to the user design the key is specific to that user design implemented in that particular PLD.

In step 908, the value of the key generated in step 906 is compared to an expected value. The expected value is typically stored outside the PLD, e.g., in an external non-volatile device that stores the configuration data for the user design. The expected value for the specific user design implemented in the specific PLD is derived using the same algorithm as the key (e.g., the same hash function of the same values). In some embodiments, the expected value is provided to the PLD as part of the configuration data, e.g., at the end of the configuration data stream. In some embodiments, the user design uses an external access port (not shown) to read the expected value from the external device.

In some embodiments, the expected value is stored in the non-volatile device in a secure environment before the end product is sold to a customer. The location of the expected value in the non-volatile device can be determined by the user for his or her particular implementation. For example, the expected value. can be stored in a Plafform Flash Memory device from Xilinx, Inc., at the end of the configuration data stream. The expected value can be retrieved, for example, using the procedure described in Xilinx application note xapp694, entitled "Reading User Data from Configuration PROMS", published on May 26, 2004 and available from Xilinx, Inc. at 2100 Logic Drive, San Jose, Calif. When this procedure is followed, the configuration image is the same for each PLD, but the flash image is different for each PLD.

In some embodiments, the expected value is stored in an SPI Flash memory device or a Parallel NOR Flash device. The expected value can be stored anywhere in the SPI Flash or Parallel NOR Flash that is not already being used to store other data. Note that some of these Flash devices have security protection registers that can be used for this purpose.

If the user trusts his or her distributor to gang program the expected values into the external memory devices, then the user can share the hash function and the data word with the distributor, who can derive the expected values and program the values into the external memory devices. Known gang programmers have the capability of generating and programming the expected values. In these embodiments, the expected value and the configuration image for a user design can both be loaded into the memory device at the same time. This approach offers the advantage that the key and the configuration image are loaded into the external memory device before the device is provided to the board manufacturer. Therefore, it is not necessary for the board manufacturer to have access to the expected value. Further, it is not necessary for the distributor to know for what purpose the programmed memories and their associated PLDs will be used. However, the memory device and its associated PLD must remain together as a pair. This limitation is not a drawback if the memory device and PLD are packaged together in a single package.

An alternative method of programming the expected value is for the boards to be brought back to the user for loading of the expected values, and subsequent testing, before shipping the completed boards to the end customer.

Note that if a determined attacker is able to copy the configuration data, e.g., by reading it from the external memory device, and to extract the expected value from the external memory device, he or she will still be unable to copy the PLD's unique identifier. Therefore, copies of the configuration data and the expected value cannot be used to authenticate another user design/PLD combination.

Returning now to FIG. 9, when the key matches the expected value, the user design/PLD combination is authenticated, and all functions in the user design are enabled (step 910). When the key does not match the expected value, the user design/PLD combination is not authenticated, and some or all functions in the user design are disabled (step 912). The enabling and disabling can be implemented in many different ways, as will be clear to those of skill in the relevant arts. For example, a portion of the PLD can be enabled by enabling internal flip-flops, de-asserting a set or reset signal, or enabling clock networks or Digital Clock Managers (DCMs). In some embodiments, when a user design/PLD combination is not authenticated, the entire user design is disabled. In other embodiments, the system is forced into a physically destructive state. In yet other embodiments, the system is allowed to operate in an "evaluation" mode for a period of time. In other embodiments, other consequences ensue, as determined by the user and as programmed into the authentication portion of the user design.

In some embodiments (not shown), a timeout circuit is inserted in the authentication logic that requires the PLD to periodically re-authenticate the user design in the PLD, e.g., to repeat steps 906-912. If the design/PLD combination fails to re-authenticate at any time, the first portion of the user design is disabled (step 912). This feature can be used, for example, by IP core developers. For example, an IP core can provide a timeout circuit (e.g., utilizing a count down clock) which allows the user to utilize a given IP core a limited number of times. The timeout circuit can limit a number of runs or data path executions, for example, or compare a stored value representing the number of configurations (e.g., stored in non-volatile memory) to a maximum value, or can use some other means to limit the functionality of the IP core. In some embodiments, a count down clock starts with a maximum value, and decrements each time the user design satisfies a predetermined condition. When the countdown clock reaches zero, the timeout circuit disables the IP core.

In some embodiments, the external memory device also includes a unique identifier. In these embodiments, the unique identifier of the memory device can optionally be used in conjunction with the unique identifier of the PLD and the data word to determine the authentication key.

Figure 10:
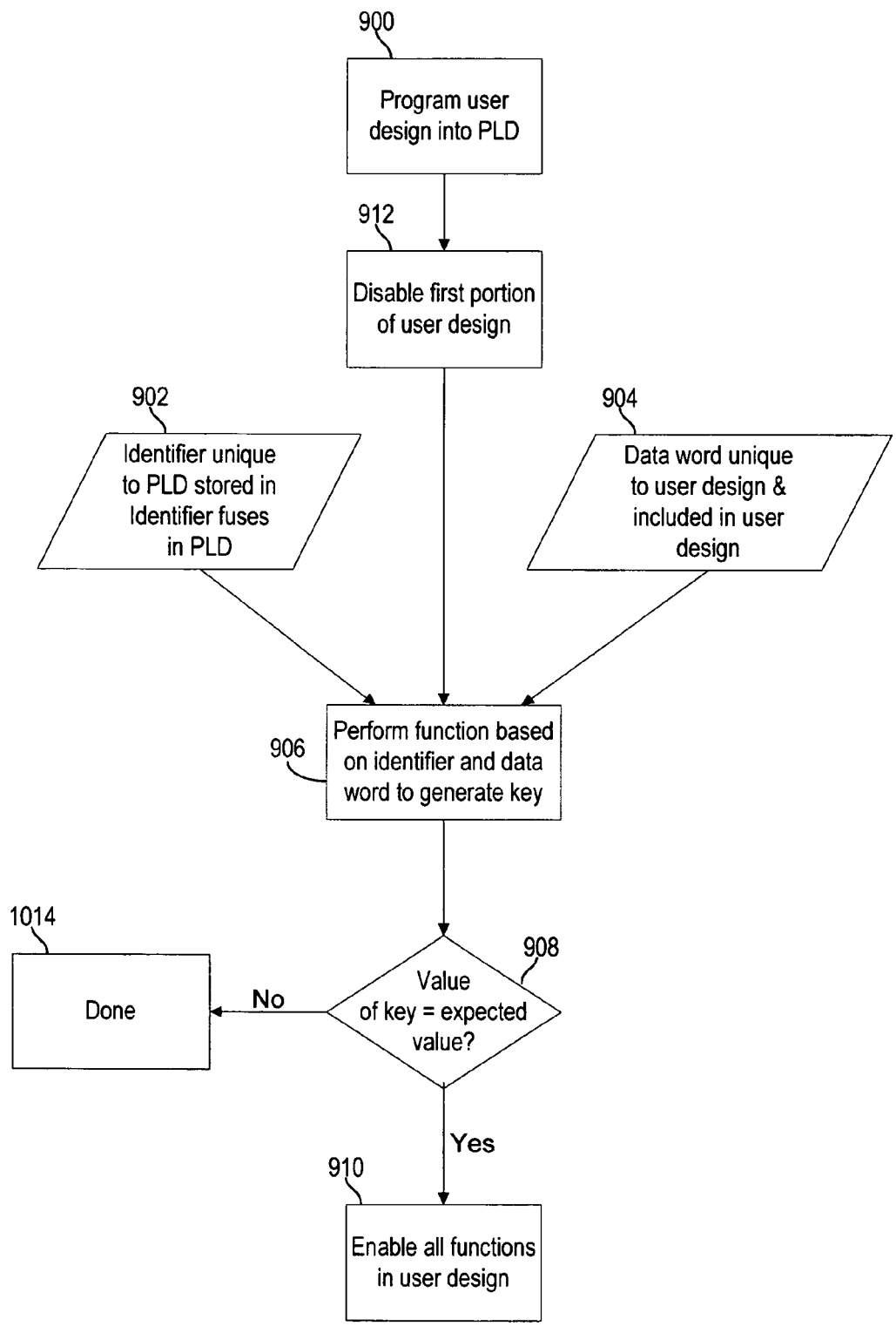
FIG. 10 illustrates the steps of a second method of authenticating a user design in a programmable IC in accordance with some embodiments of the present invention.

FIG. 10 illustrates the steps of a second method of authenticating a user design programmed into a programmable IC (e.g., a PLD). When the method of FIG. 10 is used, the first portion of the user design is disabled (step 912) during or soon after the configuration process (step 900). The function (e.g., a hash function) is then performed on the identifier 902 and the data word 904 as described in conjunction with FIG. 9, and the key is generated (step 906). When the value of the key matches the expected value, all functions in the user design are enabled (step 910). When the value of the key does not match the expected value, the process is complete (step 1014), i.e., the disabled portion(s) of the user design are not enabled.

Figure 11:
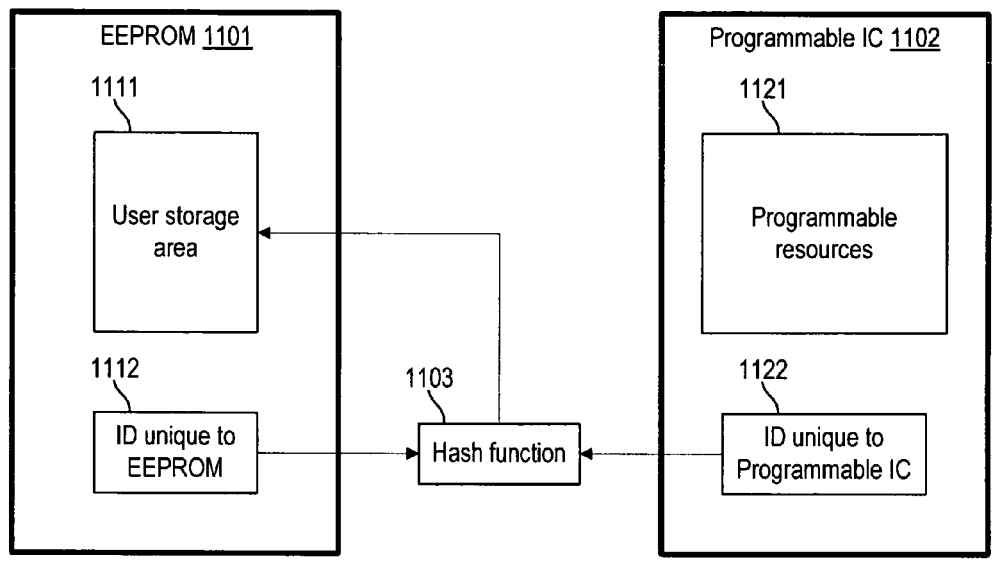
FIG. 11 is a block diagram of a system for generating an expected value and storing the expected value in an EEPROM.

FIG. 11 is a block diagram of a system for generating an expected value and storing the expected value in an EEPROM. EEPROM 1101 includes a user storage area 1111 and a memory area 1112 that includes an identifier unique to EEPROM 1101. The identifier can be, for example, permanently programmed into the non-volatile memory device using electrically programmable fuses included in the non-volatile memory device. For example, the identifier unique to the non-volatile memory device can identify a lot number, wafer number within the lot, and position of the non-volatile memory device die on the wafer. In some embodiments, the identifier is stored in a security protection register such as those included in some known memory devices.

Programmable IC 1102 includes programmable resources 1121 and a memory area 1122 that includes an identifier unique to programmable IC 1102. The identifier can be, for example, permanently programmed into the programmable IC using electrically programmable fuses included in the programmable IC. For example, the identifier unique to the programmable IC can identify a lot number, wafer number within the lot, and position of the programmable IC die on the wafer. In some embodiments, the identifier is stored in a security protection register similar to those included in some known memory devices.

The system of FIG. 11 also includes logic 1103 for performing a hash function on the two identifiers 1112 and 1122. Logic 1103 can be implemented using hardware or software, or a combination of hardware and software. Logic 1103 provides a key specific to the combination of non-volatile memory device 1101 and programmable IC 1102. If another EEPROM is substituted for EEPROM 1101, or another programmable IC is substituted for programmable IC 1102, the result of the hash function will be different. The value resulting from the hash function is stored in EEPROM 1101, e.g., in user storage area 1111. In some embodiments, a function other than the hash function, or in addition to the hash function, is performed by logic 1103, and the results are stored in user storage area 1111. However, the function is preferably selected such that the value resulting from the function is unique to the particular combination of EEPROM 1101 and programmable IC 1102.

Figure 12:
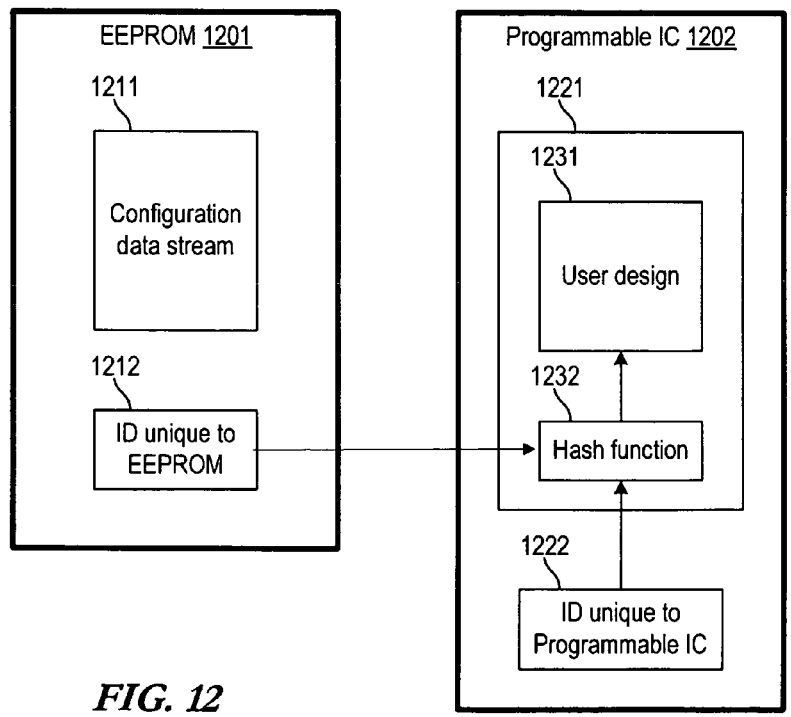
FIG. 12 is a block diagram of a system that supports the authentication of a unique combination of a programmable IC and a non-volatile memory device storing a user design for the programmable IC.

FIG. 12 is a block diagram of a system that supports the authentication of a unique combination of a programmable IC and a non-volatile memory device storing a user design for the programmable IC. EEPROM 1201 includes a user storage area 1211 and a memory area 1212 that includes an identifier unique to EEPROM 1101. A configuration data stream for a user design is stored in user storage area 1211. In some embodiments, the configuration data stream includes an expected value for a hash function of the two identifiers, e.g., the same hash function shown in FIG. 11. Programmable IC 1202 includes programmable resources 1221 and a memory area 1222 that includes an identifier unique to programmable IC 1202. The configuration data stream from EEPROM 1201 is programmed into programmable resources 1221 of the programmable IC, and includes both a user design 1231 and logic for implementing the hash function.

When the configuration data stream from EEPROM 1201 is loaded into programmable IC 1202, at least a portion of the user design can be disabled based on the results of the hash function between the two identifiers, i.e., the identifier unique to EEPROM 1201 and the identifier unique to programmable IC 1202. The key resulting from the hash function is compared to an expected value, which can be included, for example, in the configuration data stream and loaded into the programmable IC with the configuration data stream. In some embodiments, if the key matches, the entire user design is enabled. If the key does not match, at least a portion of the user design is disabled. In some embodiments, if the key does not match, some other action is taken. For example, a counter can be enabled that allows the user design to be operated for only a limited time, or permits only a limited number of operations to be performed, or some other limitation is placed on the user design. Thus, the authorized programmable IC/EEPROM combination cannot be pirated by substituting another programmable IC and/or another EEPROM into the system.

In some embodiments, the system acts to periodically re-authenticate the programmable IC/EEPROM combination, following a process similar to that previously described in reference to FIG. 9.

Figure 13:
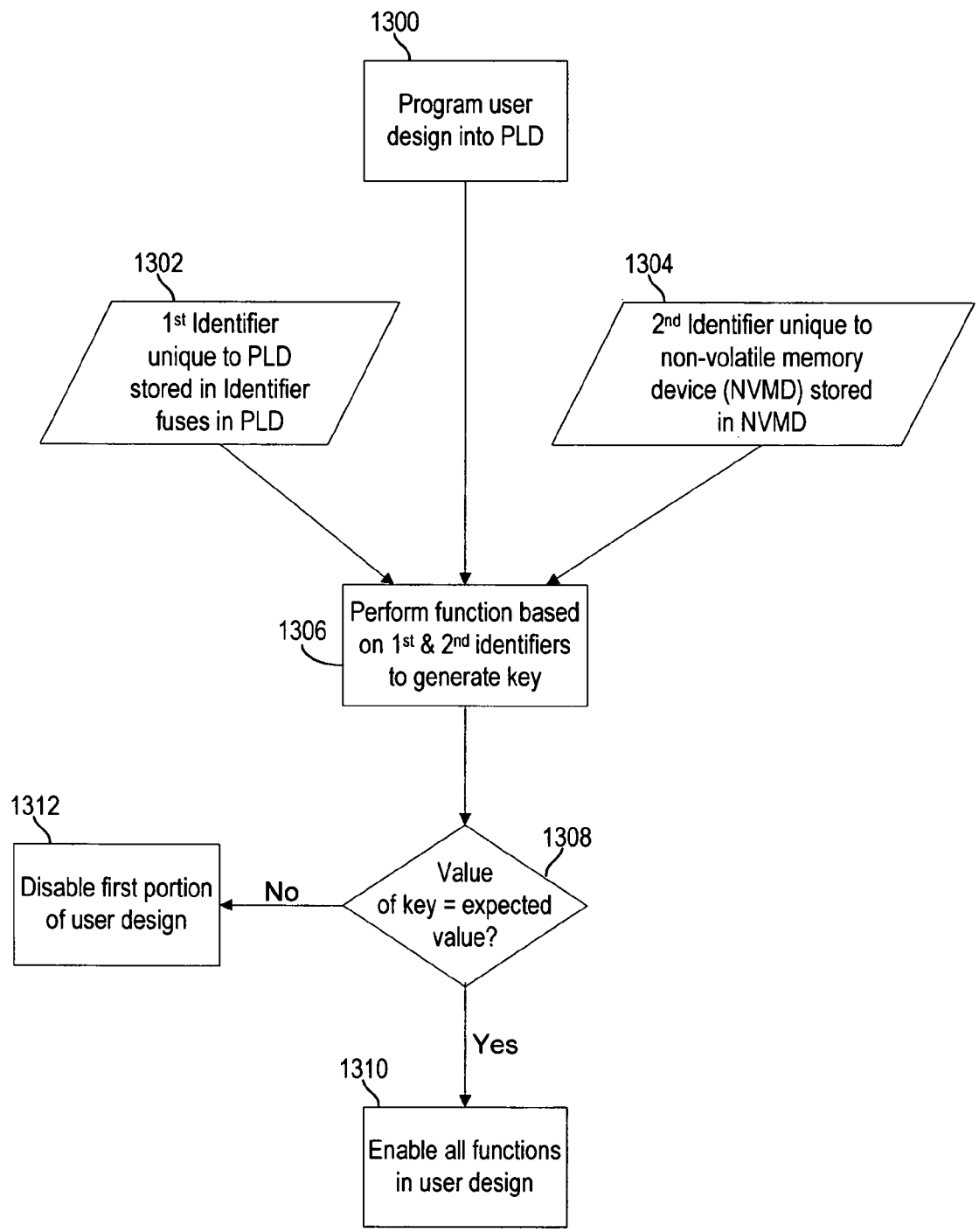
FIG. 13 illustrates the steps of a first method of authenticating a combination of a programmable IC and a non-volatile memory device in accordance with some embodiments of the present invention.

FIG. 13 illustrates the steps of a first method of authenticating a combination of a programmable IC (e.g., a PLD) and a non-volatile memory device (e.g., an EEPROM) in accordance with some embodiments of the present invention. In step 1300, the user design is programmed into the PLD by loading a stream of configuration data, e.g., from the non-volatile memory device.

For the next step, two data values are used: a first identifier 1302 that is unique to the PLD; and a second identifier 1304 that is unique to the non-volatile memory device. The first identifier 1302 can be stored in non-volatile memory in the PLD, for example, by a PLD manufacturing facility, and can identify, for example, the lot number, wafer number within the lot, and position of the PLD die on the wafer. For example, the first identifier 1302 can be written to the PLD by programming electrically programmable fuses or anti-fuses, as described above. Similarly, the second identifier can be stored in non-volatile memory in the non-volatile memory device, for example, by the manufacturing facility that manufactures the memory device. For example, the second identifier 1304 can be written to the memory device by programming electrically programmable fuses or anti-fuses, as described above. In some embodiments, the second identifier is stored in a security protection register such as those included in some known memory devices.

In step 1306, a function is performed based on the first and second identifiers 1302 and 1304, and a key is generated by the function. For example, the function can include a concatenation of the two identifiers using, for example, a circuit similar to shift register 716 of FIGS. 7 and 8. Additionally, some or all of the first identifier 1302, the second identifier 1304, and the concatenation can be added more than once to the string of bits generated by the shift register. Additionally or alternatively, the function can include a hash function, for example, of one of the two identifiers and the output of the shift register, using a circuit similar to that shown in FIG. 8. In some embodiments, no shift register is included, and the hash function is simply performed on the two identifiers. The first identifier 1302 is unique to the particular PLD and the second identifier 1304 is unique to the non-volatile memory device, so the key generated in step 1306 is specific to that particular combination of PLD and non-volatile memory device.

In step 1308, the value of the key generated in step 1306 is compared to an expected value. The expected value is typically stored outside the PLD, e.g., in the non-volatile memory device. The expected value for the PLD/memory device combination is derived using the same algorithm as the key (e.g., the same hash function of the same values). In some embodiments, the expected value is provided to the PLD as part of the configuration data, e.g., at the end of the configuration data stream. In some embodiments, the user design uses an external access port (see FIG. 12) to read the expected value from the memory device.

As was previously described in connection with FIG. 9, in some embodiments the expected value is stored in the non-volatile device in a secure environment before the end product is sold to a customer. For example, the expected value can be stored in a Platform Flash Memory device from Xilinx, Inc., in an SPI Flash memory device, or a Parallel NOR Flash device, e.g., using the security protection registers included in some of these devices. Also as previously described, the user can share the hash function with the distributor, if desired, who can derive the expected values and program the values into the external memory devices, or the users can program the expected values into the devices themselves.

Note that if a determined attacker is able to copy the configuration data, e.g., by reading it from the non-volatile memory device, and to extract the expected value from the memory device, he or she will still be unable to copy the PLD's unique identifier. Therefore, copies of the configuration data and the expected value cannot be used to authenticate another PLD/memory device combination.

Returning now to FIG. 13, when the key matches the expected value, the PLD/memory device combination is authenticated, and all functions in the user design are enabled (step 1310). When the key does not match the expected value, the PLD/memory device combination is not authenticated, and some or all functions in the user design are disabled (step 1312). The enabling and disabling can be implemented in many different ways, as was previously described in conjunction with FIG. 9. In some embodiments, when a PLD/memory device combination is not authenticated, the entire user design is disabled. In other embodiments, the system is forced into a physically destructive state. In yet other embodiments, the system is allowed to operate in an "evaluation" mode for a period of time. In other embodiments, other consequences ensue, as determined by the user and as programmed into the authentication portion of the user design.

Figure 14:
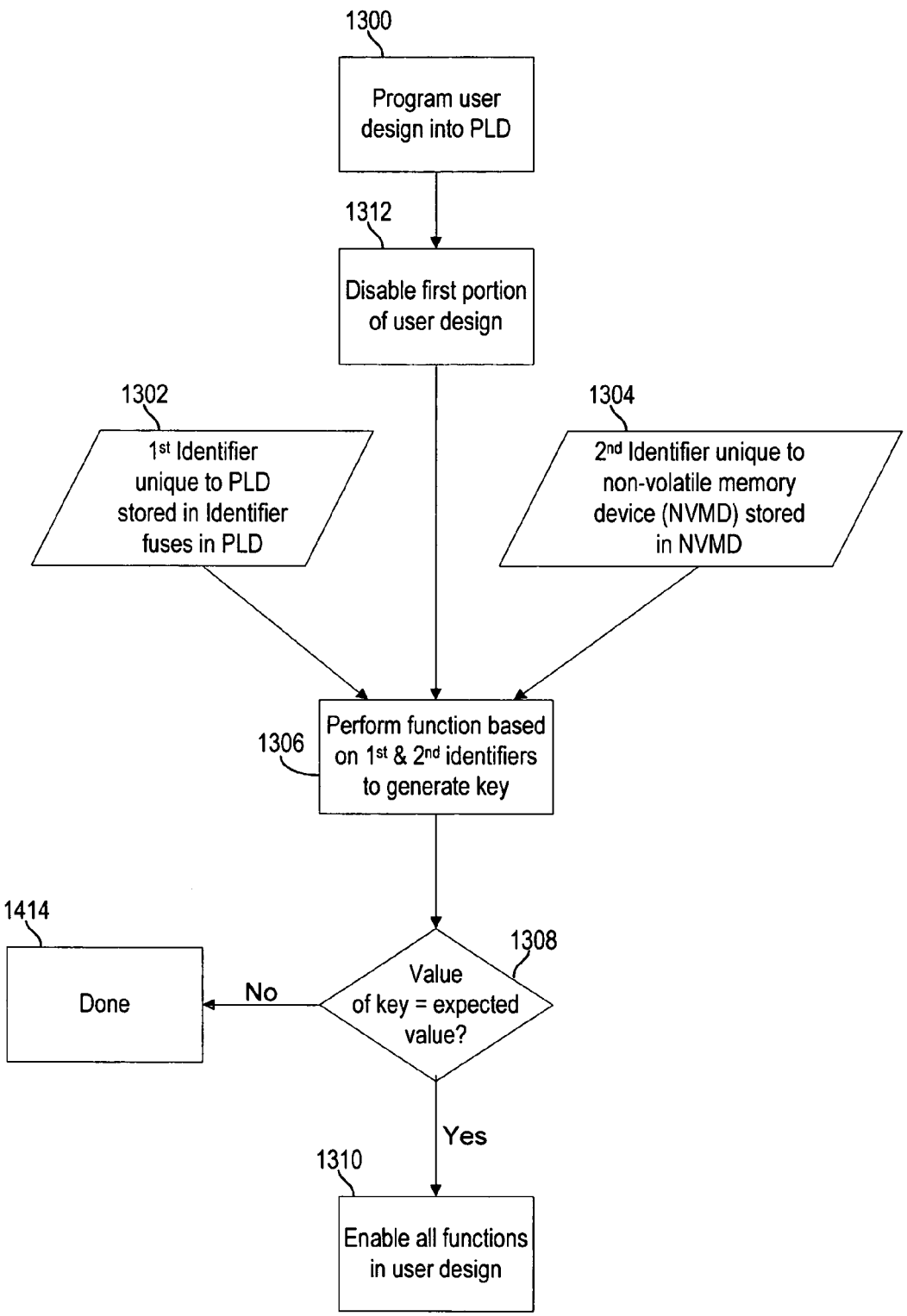
FIG. 14 illustrates the steps of a second method of authenticating a combination of a programmable IC and a non-volatile memory device in accordance with some embodiments of the present invention.

FIG. 14 illustrates the steps of a second method of authenticating a combination of a programmable IC and a non-volatile memory device in accordance with some embodiments of the present invention. When the method of FIG. 14 is used, the first portion of the user design is disabled (step 1312) during or soon after the configuration process (step 1300). The function (e.g., a hash function) is then performed on the first identifier 1302 and the second identifier 1304 as described in conjunction with FIG. 13, and the key is generated (step 1306). When the value of the key matches the expected value, all functions in the user design are enabled (step 1310). When the value of the key does not match the expected value, the process is complete (step 1414), i.e., the disabled portion(s) of the user design are not enabled.

Those having skill in the relevant arts of the invention will now perceive various modifications and additions that can be made as a result of the disclosure herein. For example, the methods of the present invention are described as being applied to PLDs. However, the authentication methods described herein can also be applied to other programmable integrated circuits (e.g., SRAM-based devices) that read their configuration data or application data from an external device (e.g., microprocessors, digital signal processors (DSP), and/or microcontrollers) and include a unique identifier. Accordingly, all such modifications and additions are deemed to be within the scope of the invention, which is to be limited only by the appended claims and their equivalents.

What is claimed is:

1. A programmable logic device (PLD), comprising:
   an array of programmable tiles including a plurality of programmable logic resources and a plurality of programmable interconnect resources;
   a set of electrically programmable fuses that is electrically programmed with an identifier of the PLD, wherein a respective one of the electrically programmable fuses is electrically programmed with each of a plurality of bits of the identifier;
   an interface port including a control port and a first and second serial data signals, the interface port coupled to a subset of the programmable tiles, wherein the control port includes a clock signal, a read signal, and a shift signal; and
   a shift register coupled to the set of electrically programmable fuses and the interface port, the shift register having a parallel input port and serial input and output signals, the shift register adapted to load the identifier from the set of electrically programmable fuses via the parallel input port in response to a read command of the control port of the interface port, the shift register adapted to serially shift by one bit in response to a shift command of the control port of the interface port, including shifting a bit from the subset of the programmable tiles to the serial input signal of the shift register via the first serial data signal of the interface port and shifting a bit from the serial output signal of the shift register to the subset of the programmable tiles via the second serial data signal of the interface port.

2. The PLD of claim 1, wherein the PLD is programmed with configuration data that configures the programmable logic and interconnect resources of the PLD to implement a user design that receives the identifier via the second serial data signal and checks for correspondence between the identifier and the configuration data.

3. The PLD of claim 1, wherein the PLD is programmed with configuration data that configures the programmable logic and interconnect resources of the PLD to implement a user design that checks a key, which has a plurality of bits that is greater than the plurality of bits of the identifier, received from the second serial data signal, which the user design couples to the first serial data signal.

4. The PLD of claim 1, wherein the PLD is programmed with configuration data that configures the programmable logic and interconnect resources of the PLD to implement a user design that checks a key, which includes the identifier and a data word, received from the second serial data signal, the user design serially supplying the data word to the first serial data signal.

5. The PLD of claim 1, wherein the control port of the interface port includes a read signal for the read command and a shift signal for the shift command.

6. The PLD of claim 5, wherein the control port of the interface port further includes a clock signal.

7. The PLD of claim 6, wherein the shift register is further adapted to serially shift by one bit in response to the shift command that is an assertion of the shift signal at an active edge of the clock signal.

8. The PLD of claim 6, wherein the shift register is further adapted to load the identifier from the set of electrically programmable fuses in response to the read command that is an assertion of the read signal at an active edge of the clock signal.

9. The PLD of claim 5, wherein the shift register is further adapted to serially shift by one bit in response to the shift command of an active pulse of the shift signal.

10. The PLD of claim 5, the shift register is further adapted to load the identifier from the set of electrically programmable fuses in response to the read command of an active pulse of the read signal.

11. The PLD of claim 1, further comprising programming pads coupled to the set of electrically programmable fuses, wherein the set of electrically programmable fuses is programmed with the identifier of the PLD during wafer probing of the PLD using the programming pads.

12. The PLD of claim 11, wherein the PLD may be identified by a location on a wafer of a lot and the identifier includes a specification of the lot, a specification of the wafer, and a specification of the location.

* * * * *